(12) United States Patent
Ha et al.

(10) Patent No.: US 11,073,547 B2
(45) Date of Patent: Jul. 27, 2021

(54) METHOD OF LOCATING A FAULT IN A POWER TRANSMISSION SCHEME

(71) Applicant: GENERAL ELECTRIC TECHNOLOGY GMBH, Baden (CH)

(72) Inventors: Hengxu Ha, Stafford (GB); Sankara Subramanian Sri Gopala Krishna Murthi, Stafford (GB); Gajendiran Balakrishnan, Stafford (GB)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 148 days.

(21) Appl. No.: 16/463,845

(22) PCT Filed: Nov. 3, 2017

(86) PCT No.: PCT/EP2017/078152
§ 371 (c)(1),
(2) Date: May 23, 2019

(87) PCT Pub. No.: WO2018/095710
PCT Pub. Date: May 31, 2018

(65) Prior Publication Data
US 2019/0331726 A1 Oct. 31, 2019

(30) Foreign Application Priority Data
Nov. 23, 2016 (EP) ..................................... 16200211

(51) Int. Cl.
*G01R 31/08* (2020.01)
(52) U.S. Cl.
CPC ......... *G01R 31/083* (2013.01); *G01R 31/085* (2013.01); *G01R 31/086* (2013.01); *G01R 31/088* (2013.01)

(58) Field of Classification Search
CPC .. G01R 31/083; G01R 31/085; G01R 31/086; G01R 31/088; Y04S 10/52
See application file for complete search history.

(56) References Cited

U.S. PATENT DOCUMENTS

| 5,661,664 A | 8/1997 | Novosel et al. |
| 8,731,853 B2 * | 5/2014 | Balcerek ............... H02J 3/1807 702/59 |

(Continued)

FOREIGN PATENT DOCUMENTS

| WO | 2011/157300 A1 | 12/2011 |
| WO | 2016/146791 A1 | 9/2016 |

OTHER PUBLICATIONS

Abe M et al: "Development of a New Fault Location System for Multi-Terminal Single Transmission Lines". IEEE Transactions on Power Delivery, IEEE Service Center, New York, NY, US, vol. 10 No. 1, Jan. 31, 1995 (Jan. 31, 1995), pp. 159-167, XP000513164.

(Continued)

*Primary Examiner* — Jay Patidar
(74) *Attorney, Agent, or Firm* — Eversheds Sutherland (US) LLP

(57) ABSTRACT

The technology described herein is generally directed to a method of locating a fault in a multi-terminal electrical power transmission scheme, such as implemented in a power transmission scheme where each of six terminals is connected with one of four junctions via a power transmission section and each junction interconnects a plurality of power transmission sections. Aspects of the described technology can be directed to measuring the voltage and current at each terminal, calculating from the measured voltage and current at each terminal corresponding voltage and current phasors, determining from the calculated voltage and current phasors a synchronization difference between the measured voltage and current at a designated terminal and the mea- (Continued)

sured voltage and current at each other terminal, modifying the calculated voltage and current phasors to compensate for each synchronization difference, and determining from the compensated voltage and current phasors the location of the fault.

9 Claims, 6 Drawing Sheets

(56) References Cited

U.S. PATENT DOCUMENTS

| | | | |
|---|---|---|---|
| 2013/0181755 A1* | 7/2013 | Li | H02H 3/283 |
| | | | 327/156 |
| 2014/0229127 A1* | 8/2014 | Ren | G01R 31/088 |
| | | | 702/59 |

OTHER PUBLICATIONS

Goldemberg C et al: "Automated Fault Location System for Primary Distribution Networks". IEEE Transactions on Power Delivery, IEEE Service Center, New York, NY, US, vol. 20, No. 2, Apr. 30, 2005 (Apr. 30, 2005), pp. 1332-1340. XP011129301.

Girgis A A et al: A New Fault Location Technique for Two-And Three-Terminal Lines.IEEE Transactions on Power Delivery, IEEE Service Center, New York, NY, US, vol. 7, No. 1, Jan. 31, 1992 (Jan. 31, 1992), pp. 98-107, XP000247100.

Kezunovic M et al: "A novel method for transmission network fault location using genetic algorithms and sparse fiel recordings", 2002 IEEE Power Engineering Society. Summer Meeting. Conference Proceedings. Chicago, IL, Jul. 21-25, 2002; [IEEE Power Engineering Society] New York, NY: IEEE, US, Jul. 25, 2002 (Jul. 25, 2002) p. 1101, XP031212751.

European Search Report dated May 19, 2017.

* cited by examiner

METHOD OF LOCATING A FAULT IN A POWER TRANSMISSION SCHEME

CROSS-REFERENCE TO RELATED APPLICATIONS

This application is a U.S. National Stage Application under 35 U.S.C. § 371 and claims the priority benefit of International Application No. PCT/EP2017/078152 filed Nov. 3, 2017, which claims priority to EP16200211.7, filed Nov. 23, 2016, which are incorporated herein by reference.

This invention relates to a method of locating a fault in a multi-terminal power transmission scheme.

According to an aspect of the invention there is provided a method of locating a fault in a multi-terminal electrical power transmission scheme in which each terminal is connected with a junction via a power transmission section and the or each junction interconnects a plurality of power transmission sections, the method comprising the steps of:
(a) measuring the voltage and current at each terminal;
(b) calculating from the measured voltage and current at each terminal corresponding voltage and current phasors;
(c) determining from the calculated voltage and current phasors a synchronisation difference between the measured voltage and current at a designated terminal and the measured voltage and current at the or each other terminal;
(d) modifying the calculated voltage and current phasors to compensate for the or each synchronisation difference; and
(e) determining from the compensated voltage and current phasors the location of the fault.

The voltage and current at each terminal are typically recorded, i.e. measured, by a disturbance recorder in a respective relay, i.e. a respective circuit breaker, which is operatively deployed with each terminal. More particularly the voltage and current values are usually recorded in a COMmon format of TRAnsient Data Exchange (COMTRADE) format which provides for universal readability of the underlying data.

The method of the invention makes use of such readily available data to allow for the off-line determination of a fault location within an electrical power transmission scheme.

Preferably step (a) of measuring the voltage and current at each terminal includes resampling the measured voltage and current from one or more terminals.

The voltage and current data, e.g. the COMTRADE data, from different terminals may have been obtained at different sampling rates, for example if the associated relays are produced by different manufacturers. Resampling the measured voltage and current data from one or more terminals desirably permits all of the data to thereafter have the same equivalent sampling rate, and so facilitates subsequent use of all the data in the method of the invention.

Optionally the power transmission scheme is a multi-phase power transmission scheme, and
step (a) of measuring the voltage and current at each terminal includes measuring the voltage and current of each phase at each terminal, and
step (b) of calculating from the measured voltage and current at each terminal corresponding voltage and current phasors includes converting the measured phase voltages and phase currents into respective phase phasors and then transforming the phase phasors into respective positive and negative sequence voltage phasors and positive and negative sequence current phasors.

The method may further include the step of determining from the measured phase currents whether a fault has occurred and if a fault has occurred whether it effects all phases.

In a preferred embodiment of the invention if the fault effects all phases then the positive sequence voltage and current phasors are used in subsequent steps of the invention, otherwise the negative sequence voltage and current phasors are used.

Positive sequence voltage and current phasors are always available, irrespective of the type of fault. Otherwise, so long as the fault does not effect all phases then the negative sequence voltage and current phasors are used in subsequent steps of the invention because they desirably omit load components and so are contaminated to a lesser extent under fault conditions.

Step (c) of determining from the calculated voltage and current phasors a synchronisation difference between the measured voltage and current at a designated terminal and the measured voltage and current at the or each other terminal may include:
calculating, with respect to the designated terminal, an equivalent current flowing at the or each other terminal;
equating, in respect of the or each other terminal, a sum of the measured current and the calculated equivalent current to zero according to Kirchhoff's first law; and
extracting, in respect of the or each other terminal, a synchronisation difference between the measured voltage and current at the designated terminal and the measured voltage and current at the said respective other terminal from a corresponding equated sum of currents.

The calculation, with respect to the designated terminal, of an equivalent current flowing at the or each other terminal, provides the method of the invention with a desired degree of scalability and so permits its use with a wide range of different power transfer scheme configurations having, e.g. a significantly different number of terminals and/or junctions interconnecting those terminals Meanwhile, equating, in respect of the or each other terminal, a sum of the measured current and the calculated equivalent current to zero according to Kirchhoff's first law readily and reliably permits the subsequent extraction of a corresponding synchronisation difference.

Preferably calculating, with respect to the designated terminal, an equivalent current flowing at the or each other terminal includes establishing an equivalent admittance matrix for the power transmission scheme.

The utilisation of an equivalent admittance matrix for the power transmission scheme to calculate an equivalent current flowing at the or each other terminal, has the benefit of removing from such a calculation any unknowns, e.g. regarding the status of current flow, in respect of the or each corresponding equivalent current, and so permits in a subsequent step the ready extraction of a corresponding synchronisation difference since the associated equated sum of currents can be manipulated to include only one unknown, i.e. the required synchronisation difference.

In another preferred embodiment of the invention step (e) of determining from the compensated voltage and current phasors the location of the fault includes:

designating a terminal at a first end of the power transmission scheme as a first end terminal and a terminal at a second end of the power transmission scheme as a second end terminal;

obtaining a first set of voltage phasors, wherein the first set of voltage phasors includes the compensated voltage phasor at the first end terminal and further includes respective voltage phasors at each of the second end terminal and the or each junction that are determined based on the compensated first end terminal voltage phasor;

obtaining a second set of voltage phasors, wherein the second set of voltage phasors includes the compensated voltage phasor at the second end terminal and further includes respective voltage phasors at each of the first end terminal and the or each junction that are determined based on the compensated second end terminal voltage phasor; and comparing the first and second sets of voltage phasors to identify the power transmission section or junction corresponding to the location of the fault, wherein each voltage phasor of the first set of voltage phasors is compared to the respective voltage phasor of the second set of voltage phasors that corresponds to the same end terminal or junction.

These steps not only result in efficient determination of the location of a fault in a power transmission scheme, but also are accurate due to the consideration of the distributed parameters of the power transmission scheme. In addition these steps are readily scalable to accommodate different topologies of power transmission scheme. The latter is particularly advantageous for use in a power transmission scheme with a complex layout, such as a multi-ended power transmission scheme.

These steps therefore permit quick determination of the location of a fault in a power transmission scheme, which reduces the time required to locate and repair the fault and thereby minimises the downtime of the power transmission scheme.

The method may further include the step, if a given power transmission section is identified as the location of the fault, of determining the distance of the fault along the power transmission section using corresponding voltages and currents of an equivalent two-ended system.

Such a step identifies with even more accuracy the location of the fault, and so reduces the time taken to find and deal with the said fault.

There now follows a brief description of preferred embodiments of the invention, by way of non-limiting example, with reference being made to the following figures in which.

Figure 1:
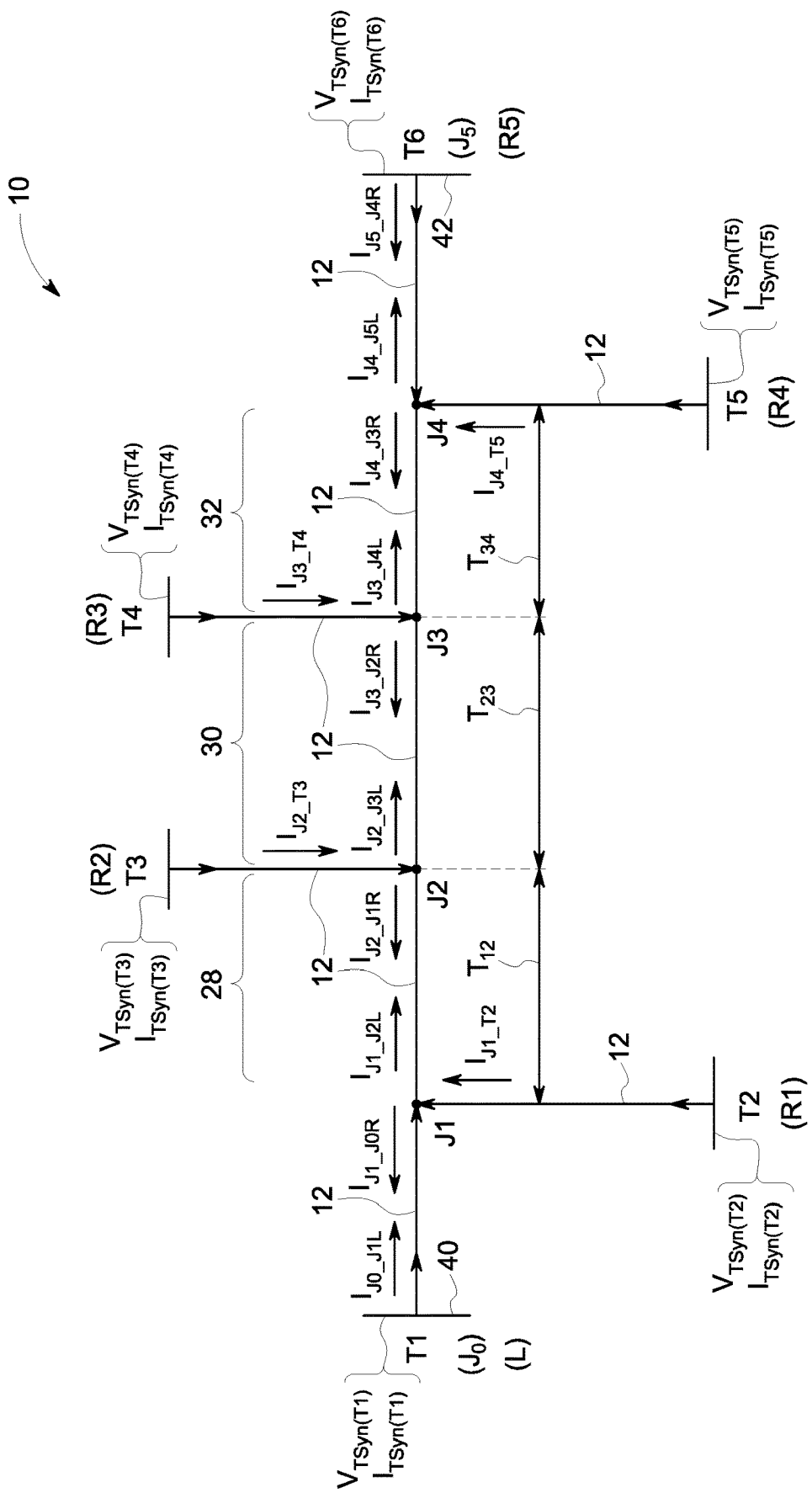
FIG. 1 shows a schematic representation of an example multi-terminal power transmission scheme.

An example multi-terminal electrical power transmission scheme is designated generally by reference numeral 10 and is shown schematically in FIG. 1.

The power transmission scheme 10 includes first, second, third, fourth, fifth and sixth terminals T1, T2, T3, T4, T5, T6 and first, second, third and fourth junctions J1, J2, J3, J4. The terminals T1, T2, T3, T4, T5, T6 and junctions J1, J2, J3, J4 are interconnected with one another by respective power transmission sections 12, e.g. respective power transmission lines or other transmission conduits such as underground cables. The voltage and current at each terminal T1, T2, T3, T4, T5, T6 is measured and then recorded in the COMTRADE format.

Other multi-terminal power transmission schemes are also possible and the method of the invention is equally capable of locating a fault in these other power transmission schemes.

Returning to the example power transmission scheme 10 shown, a method according to a first embodiment of the invention locates a fault with the transmission scheme 10.

Figure 2:
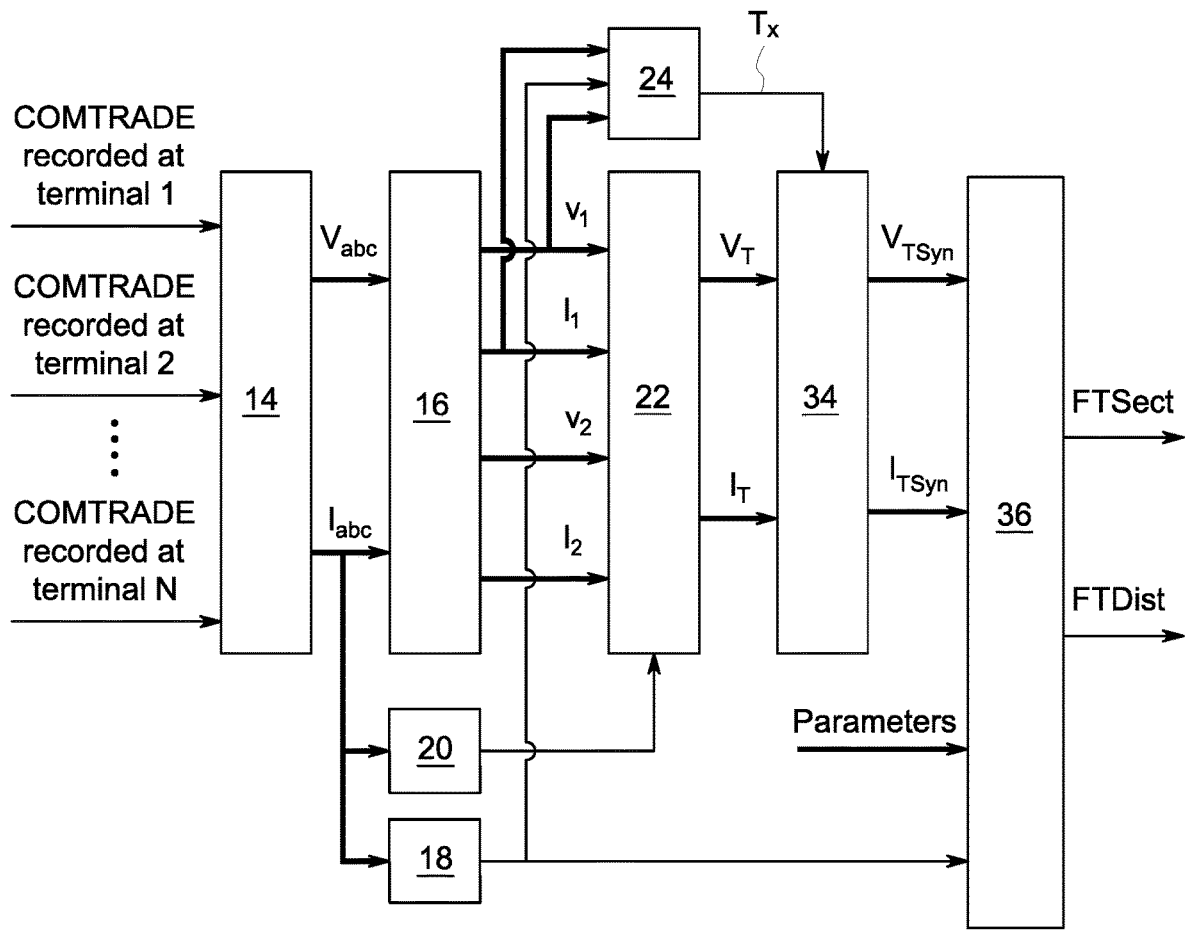
FIG. 2 shows a schematic view of an overall structure of a method according to a first embodiment of the invention.

The overall structure of the method is illustrated schematically in FIG. 2 and comprises the principle steps of:

(a) measuring the voltage and current at each terminal T1, T2, T3, T4, T5, T6;

(b) calculating from the measured voltage and current at each terminal T1, T2, T3, T4, T5, T6 corresponding voltage and current phasors $V_1$, $I_1$, $V_2$, $I_2$;

(c) determining from the calculated voltage and current phasors $V_1$, $I_1$ a synchronisation difference Tp1, Tp2, Tp3, Tp4, Tp5 between the measured voltage and current, i.e. the recorded COMTRADE data, at a designated terminal T1 and the measured voltage and current, i.e. the recorded COMTRADE data, at each other terminal T2, T3, T4, T5, T6;

(d) modifying the calculated voltage and current phasors $V_1$, $I_1$, $V_2$, $I_2$ to compensate for each synchronisation difference Tp1, Tp2, Tp3, Tp4, Tp5; and (e) determining from the compensated voltage and current phasors $V_{TSyn}$, $I_{TSyn}$ the location of the fault.

More particularly, step (a) of measuring the voltage and current at each terminal T1, T2, T3, T4, T5, T6, i.e. reading the COMTRADE data recorded at each terminal T1, T2, T3, T4, T5, T6, additionally includes resampling the measured voltage and current from one or more of the terminals T1, T2, T3, T4, T5, T6.

By way of example, such resampling may include determining the minimum sampling rate of measured voltages and currents from all of the terminals T1, T2, T3, T4, T5, T6 and down sampling, as needed, the other measured voltages and currents to the minimum sampling rate.

If the original sampling rate of one or more of the other measured voltages and currents is not an integer multiple of the minimum sampling rate then interpolation is needed. One possible interpolation algorithm (although others may be used) is $$x_{resmp}(k) = x(n) + \Delta n[x(n+1) - x(n)]$$

where, $x(n)$ is a sample series to be resampled;

$x_{resmp}$ is the sample series after resampling;

n is floor[kfs/$f_{min}$];

$\Delta n$ is kfs/$f_{min}$−n;

fs is the original sampling rate; and $f_{min}$ is the minimum sampling rate

The example power transmission scheme 10 is a three-phase scheme (although the method of the invention is also applicable to schemes having fewer than or more than three phases), and so the aforementioned measuring and resampling steps are applied at each terminal T1, T2, T3, T4, T5, T6 to each phase a, b, c. The aforementioned measuring and resampling steps for each terminal T1, T2, T3, T4, T5, T6 take place inside a first block 14 within the overall structure shown in FIG. 2.

Thereafter, step (b) of calculating from the measured voltage and current at each terminal corresponding voltage and current phasors takes place within a second block 16, and more particularly includes converting the measured phase voltages $V_{abc}$ and phase currents $I_{abc}$ into respective voltage phase phasors $V_a$, $V_b$, $V_c$ and current phase phasors $I_a$, $I_b$, $I_c$, and then transforming the voltage phase phasors $V_a$, $V_b$, $V_c$ into respective positive and negative sequence voltage phasors $V_1$, $V_2$ and the current phase phasors $I_a$, $I_b$, $I_c$ into respective positive and negative sequence current phasors $I_1$, $I_2$.

Figure 3:
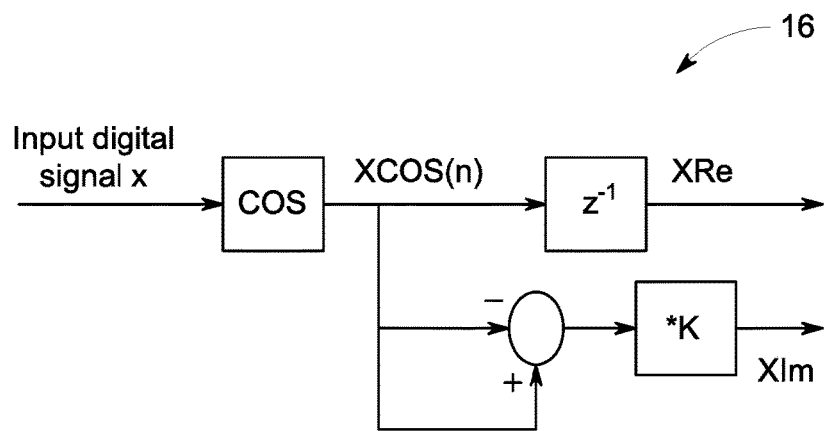
FIG. 3 shows various steps which take place within a second block shown in FIG. 2.

One way of converting the measured phase voltages $V_{abc}$ into respective voltage phase phasors $V_a$, $V_b$, $V_c$, and the measured phase currents $I_{abc}$ into respective current phase phasors $I_a$, $I_b$, $I_c$, is to apply a Fourier transform of the type illustrated schematically in FIG. 3.

More particularly, by way of example, the algorithm for the COS filter is $$X_{COS}(n) = \frac{2}{N}\sum_{k=1}^{N} x(n-N+k)\cos\left(\frac{2\pi k}{N} - \frac{\pi}{N}\right)$$

with the real and imaginary parts of each phasor $V_a$, $V_b$, $V_c$, $I_a$, $I_b$, $I_c$ being $$\begin{cases} X_{Re}(n) = X_{COS}(n-1) \\ X_{Im}(n) = [X_{COS}(n-2) - X_{COS}(n)] \cdot K \end{cases}$$

where,
K is $1/(2\sin(2\pi/N))$; and
N is the number of samples per cycle.

The three voltage phase phasors $V_a$, $V_b$, $V_c$ can then be transformed into respective positive and negative sequence voltage phasors $V_1$, $V_2$ according to $$\begin{cases} V_1 = (V_a + aV_b + a^2V_c)/3 \\ V_2 = (V_a + a^2V_b + aV_c)/3 \end{cases}$$

and the current phase phasors $I_a$, $I_b$, $I_c$ can be transformed into respective positive and negative sequence current phasors $I_1$, $I_2$ according to $$\begin{cases} I_1 = (I_a + aI_b + a^2I_c)/3 \\ I_2 = (I_a + a^2I_b + aI_c)/3 \end{cases}$$

In addition to the foregoing, the first embodiment method of the invention also includes the step of determining from the measured phase currents $I_{abc}$ whether a fault has occurred and, if a fault has occurred, whether it effects all phases a, b, c.

Determining whether a fault has occurred, which takes place within a third block 18 shown in FIG. 2, may be carried out according to any technique well known to a person skilled in the art, such as considering the sum of negative sequence current, zero sequence current and phase current, or by considering delta phase current.

Figure 4A:
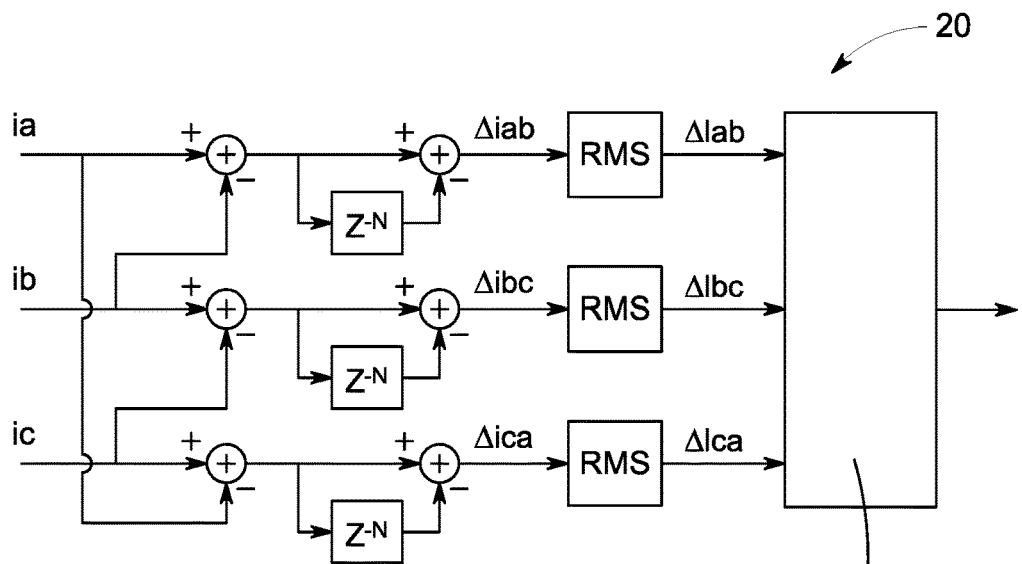
FIG. 4(a) shows various steps which take place within a fourth block shown in FIG. 2.
Figure 4B:
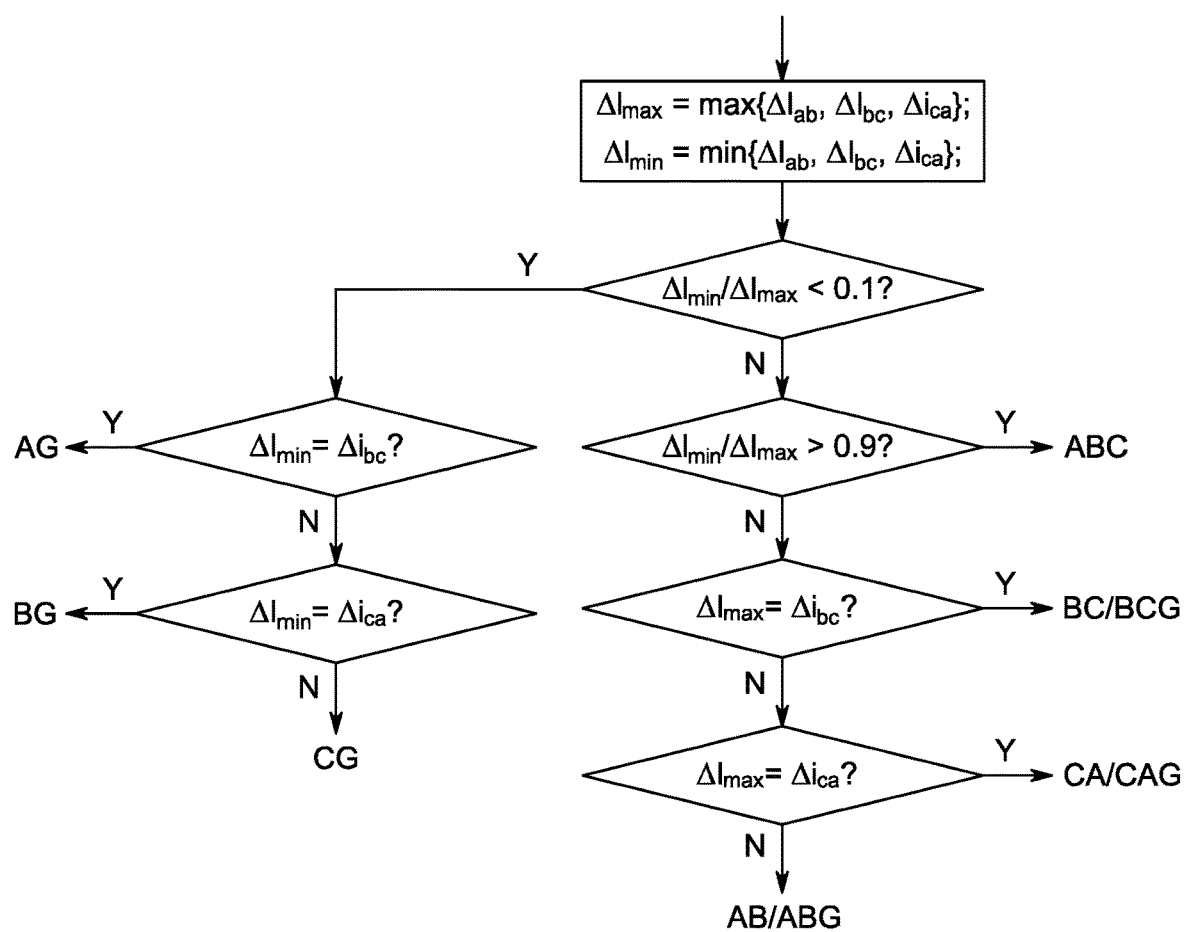
FIG. 4(b) shows a selection algorithm which forms one of the steps shown in FIG. 4(a)

Meanwhile, one way (if a fault is determined to have occurred) of determining whether the fault effects all phases a, b, c is to consider respective delta phase to phase currents $\Delta i_{ab}$, $\Delta i_{bc}$, $\Delta i_{ca}$ in the manner illustrated schematically in FIGS. 4(a) and 4(b). Such consideration takes place within a fourth block 20 in FIG. 2.

More particularly, once respective delta phase to phase currents $\Delta i_{ab}$, $\Delta i_{bc}$, $\Delta i_{ca}$ have be calculated according to $$\begin{cases} \Delta i_{ab}(n) = [i_a(n) - i_b(n)] - [i_a(n-N) - i_b(n-N)] \\ \Delta i_{bc}(n) = [i_b(n) - i_c(n)] - [i_b(n-N) - i_c(n-N)] \\ \Delta i_{ca}(n) = [i_c(n) - i_a(n)] - [i_c(n-N) - i_a(n-N)] \end{cases}$$

where N is the number of samples per cycle,
then Root Mean Squared (RMS) values of delta phase to phase currents $\Delta I_{ab}$, $\Delta I_{bc}$, $\Delta I_{ca}$ are calculated, e.g. using a half-cycle Fourier integral as shown below $$X_{RMS}(n) = \frac{\pi}{\sqrt{2}N}\sum_{k=1}^{N}\left|x\left(n - \frac{N}{2} + k\right)\right|$$

where N is again the number of samples per cycle.
Other ways of calculating Root Mean Squared (RMS) values of delta phase to phase currents $\Delta I_{ab}$, $\Delta I_{bc}$, $\Delta I_{ca}$ are also possible, however, such as a one-cycle Fourier method or by a norm calculation.

Thereafter the or each faulty phase may be determined by applying the selection algorithm illustrated schematically in FIG. 4(b), i.e. so as to identify a single phase fault to ground AG, BG, CG; a two-phase fault between two phases or between two phases and ground AB/ABG; BC/BCG, CA/CAG; or a three phase fault ABC.

If the fault effects all phases a, b, c then the first embodiment method of the invention determines that the positive sequence voltage and current phasors $V_1$, $I_1$ are to be used in subsequent steps of the method. Otherwise, i.e. if some other fault of those identified above occurs, the method of the invention determines that the negative sequence voltage and current phasors $V_2$, $I_2$ are to be used subsequently in the method. Such determination of whether to use positive or negative sequence phasors takes place within a fifth block 22 in the FIG. 2 structure and leads to the use in some subsequent steps of the method of the invention of a selected voltage phasor $V_T$ and a selected current phasor $I_T$ corresponding to each terminal T1, T2, T3, T4, T5, T6.

Meanwhile step (c), i.e. determining from the calculated voltage and current phasors (e.g. the positive sequence voltage and current phasors $V_1$, $I_1$) a synchronisation difference Tp1, Tp2, Tp3, Tp4, Tp5 between the measured voltage and current at a designated terminal T1 and the measured voltage and current at each other terminal T2, T3, T4, T5, T6, takes place within a sixth block 24 shown in FIG. 2.

The main steps within step (c) are:
calculating, with respect to the designated terminal T1, an equivalent current flowing at the or each other terminal T2, T3, T4, T5, T6;

equating, in respect of the or each other terminal T2, T3, T4, T5, T6, a sum of the measured current $i_{JR1}$, $i_{JR2}$, $i_{JR3}$, $i_{JR4}$, $i_{JR5}$ and the calculated equivalent current $i_{JR1\_L}$, $i_{JR2\_L}$, $i_{JR3\_L}$, $i_{JR4\_L}$, $i_{JR5\_L}$ to zero according to Kirchhoff's first law; and extracting, in respect of the or each other terminal T2, T3, T4, T5, T6, a synchronisation difference Tp1, Tp2, Tp3, Tp4, Tp5 between the measured voltage and current at the designated terminal T1 and the measured voltage and current at the said respective other terminal T2, T3, T4, T5, T6 from a corresponding equated sum of currents.

For the purpose of describing step (c) in more detail the additional nomenclature shown in FIG. 1 is adopted with respect to the six terminals T1, T2, T3, T4, T5, T6. More particularly, the designated terminal T1, i.e. the first terminal T1, is referred to as a local terminal L and each of the other second, third, fourth, fifth and sixth terminals T2, T3, T4, T5, T6 is considered respectively as a first, second, third, fourth and fifth remote terminal R1, R2, R3, R4, R5.

It should be noted that the first terminal T1 need not necessarily be the designated terminal, i.e. need not necessarily be referred to as the local terminal L, and that in other embodiments of the method of the invention one of the other terminals T2, T3, T4, T5, T6 may instead be the designated terminal (and hence considered, for the purpose of identifying respective synchronisation differences, as the local terminal L).

Calculating, with respect to the designated terminal (T1), an equivalent current flowing at each other terminal T2, T3, T4, T5, T6, i.e. calculating respective first, second, third, fourth and fifth equivalent currents $i_{JR1\_L}$, $i_{JR2\_L}$, $i_{JR3\_L}$, $i_{JR4\_L}$, $i_{JR5\_L}$ at each of the first, second, third, fourth and fifth remote terminals R1, R2, R3, R4, R5, includes:

establishing an equivalent admittance $y_{eR1}$, $y_{eR2}$, $y_{eR3}$, $y_{eR4}$, $y_{eR5}$ for each remote terminal R1, R2, R3, R4, R5;

establishing an initial admittance matrix $Y_0$ with respect to the or each junction, i.e. the first, second, third and fourth junctions J1, J2, J3, J4 in the particular example embodiment shown;

combining the equivalent admittance $y_{eR1}$, $y_{eR2}$, $y_{eR3}$, $y_{eR4}$, $y_{eR5}$ for each remote terminal R1, R2, R3, R4, R5 with the initial admittance matrix $Y_0$ to establish an equivalent admittance matrix $Y_{Mod}$;

obtaining a local equivalent current $i_{JL}$; and utilising the equivalent admittance matrix $Y_{Mod}$ and the local equivalent current $i_{JL}$ to calculate the corresponding equivalent current $i_{JR1\_L}$, $i_{JR2\_L}$, $i_{JR3\_L}$, $i_{JR4\_L}$, $i_{JR5\_L}$ for each remote terminal R1, R2, R3, R4, R5.

In terms of establishing an equivalent admittance $y_{eR1}$, $y_{eR2}$, $y_{eR3}$, $y_{eR4}$, $y_{eR5}$ for each remote terminal R1, R2, R3, R4, R5, each of the currents $i_{JR2}$, $i_{JR3}$, $i_{JR4}$, $i_{JR5}$ measured at the second, third, fourth and fifth remote terminals R2, R3, R4, R5 can be considered instead as a corresponding equivalent second, third, fourth and fifth admittance $y_{eR2}$, $y_{eR3}$, $y_{eR4}$, $y_{eR5}$.

The equivalent admittance $y_{eR1}$, $y_{eR2}$, $y_{eR3}$, $y_{eR4}$, $y_{eR5}$ for each remote terminal R1, R2, R3, R4, R5 may be established by a sample based method or a Fourier based method.

By way of example, the method of the invention utilises a Fourier based method whereby $$y_{eR1} = \frac{i_{JR1}}{\dot{V}_{JR1}}$$

-continued $$y_{eR2} = \frac{i_{JR2}}{\dot{V}_{JR2}}$$

$$y_{eR3} = \frac{i_{JR3}}{\dot{V}_{JR3}}$$

$$y_{eR4} = \frac{i_{JR4}}{\dot{V}_{JR4}}$$

$$y_{eR5} = \frac{i_{JR5}}{\dot{V}_{JR5}}$$

where, $i_{JR1}$ is the Fourier phasor of the measured current $i_{JR1}$ at the first remote terminal R1, i.e. is the positive sequence current phasor $I_1$ corresponding to the first remote terminal R1, which embodies a first synchronisation difference, e.g. a first time difference Tp1, between the measured voltage and current at the first remote terminal R1 and the measured voltage and current at the local terminal L;

$\dot{V}_{JR1}$ is the Fourier phasor of the measured voltage $v_{JR1}$ at the first remote terminal R1, i.e. is the positive sequence voltage phasor $V_1$ corresponding to the first remote terminal R1 (which can be calculated from the COMTRADE data for the first remote terminal R1), and which again embodies a first synchronisation difference Tp1;

$i_{JR2}$ is the Fourier phasor of the measured current $i_{JR2}$ at the second remote terminal R2, i.e. is the positive sequence current phasor $I_1$ corresponding to the second remote terminal R2, which embodies a second synchronisation difference, e.g. a second time difference Tp2, between the measured voltage and current at the second remote terminal R2 and the measured voltage and current at the local terminal L;

$\dot{V}_{JR2}$ is the Fourier phasor of the measured voltage $v_{JR2}$ at the second remote terminal R2, i.e. is the positive sequence voltage phasor $V_1$ corresponding to the second remote terminal R2 (which can be similarly calculated from corresponding COMTRADE data), and which again embodies a second synchronisation difference Tp2;

$i_{JR3}$ is the Fourier phasor of the measured current $i_{JR3}$ at the third remote terminal R3, i.e. is the positive sequence current phasor $I_1$ corresponding to the third remote terminal R3, which embodies a third synchronisation difference, e.g. a third time difference Tp3, between the measured voltage and current at the third remote terminal R3 and the measured voltage and current at the local terminal L;

$\dot{V}_{JR3}$ is the Fourier phasor of the measured voltage $v_{JR3}$ at the third remote terminal R3, i.e. is the positive sequence voltage phasor $V_1$ corresponding to the third remote terminal R3 (which can be similarly calculated from corresponding COMTRADE data), and which again embodies a third synchronisation difference Tp3;

$i_{JR4}$ is the Fourier phasor of the measured current $i_{JR4}$ at the fourth remote terminal R4, i.e. is the positive sequence current phasor $I_1$ corresponding to the fourth remote terminal R4, which embodies a fourth synchronisation difference, e.g. a fourth time difference Tp4, between the measured voltage and current at the fourth remote terminal R4 and the measured voltage and current at the local terminal L;

$\dot{V}_{JR4}$ is the Fourier phasor of the measured voltage $v_{JR4}$ at the fourth remote terminal R4, i.e. is the positive sequence voltage phasor $V_1$ corresponding to the fourth remote terminal R4 (which can be similarly calculated from corresponding COMTRADE data), and which again embodies a fourth synchronisation difference Tp4;

$i_{JR5}$ is the Fourier phasor of the measured current $i_{JR5}$ at the fifth remote terminal R5, i.e. is the positive sequence current phasor $I_1$ corresponding to the fifth remote terminal R5, which embodies a fifth synchronisation difference, e.g. a fifth time difference Tp5, between the measured voltage and current at the fifth remote terminal R5 and the measured voltage and current at the local terminal L; and $\dot{V}_{JR5}$ is the Fourier phasor of the measured voltage $v_{JR5}$ at the fifth remote terminal R5, i.e. is the positive sequence voltage phasor $V_1$ corresponding to the fifth remote terminal R5 (which can be similarly calculated from corresponding COMTRADE data), and which again embodies a fifth synchronisation difference Tp5.

Figure 5A:
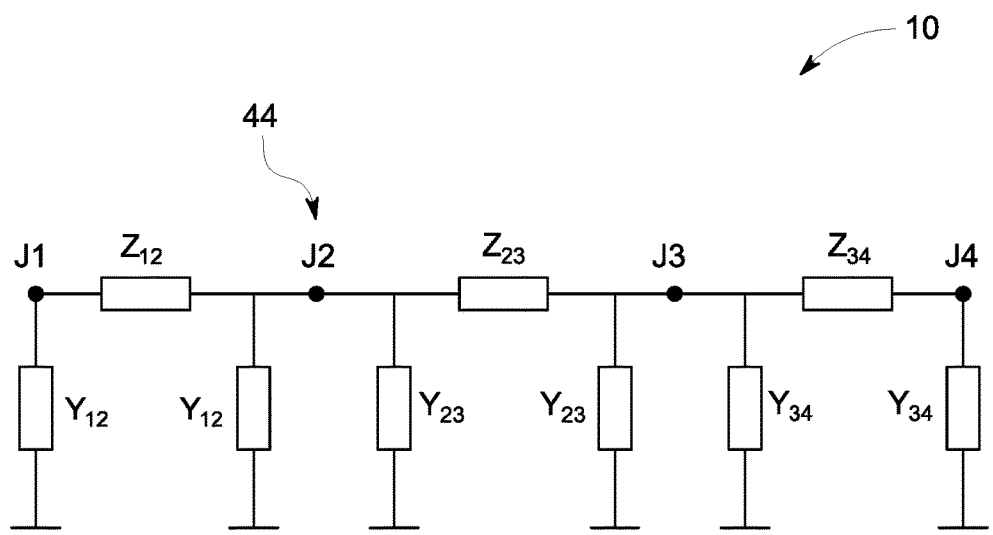
FIG. 5(a) shows an initial admittance representation of the power transmission scheme shown in FIG. 1.

Thereafter, an initial admittance matrix $Y_0$ is established with respect to the first, second, third and fourth junctions J1, J2, J3, J4, i.e. with respect only to the power transmission sections 12 between adjacent pairs of junctions J1-J2, J2-J3, J3-J4, in accordance with the initial admittance representation 44 of the power transmission scheme (10) shown in FIG. 5(a), to give:

$$Y_0 = \begin{bmatrix} y_{12} + \frac{1}{z_{12}} & -\frac{1}{z_{12}} & 0 & 0 \\ -\frac{1}{z_{12}} & y_{12} + \frac{1}{z_{12}} + \frac{1}{z_{23}} + y_{23} & -\frac{1}{z_{23}} & 0 \\ 0 & -\frac{1}{z_{23}} & y_{23} + \frac{1}{z_{23}} + \frac{1}{z_{34}} + y_{34} & -\frac{1}{z_{34}} \\ 0 & 0 & -\frac{1}{z_{34}} & y_{34} + \frac{1}{z_{34}} \end{bmatrix}$$

Figure 5B:
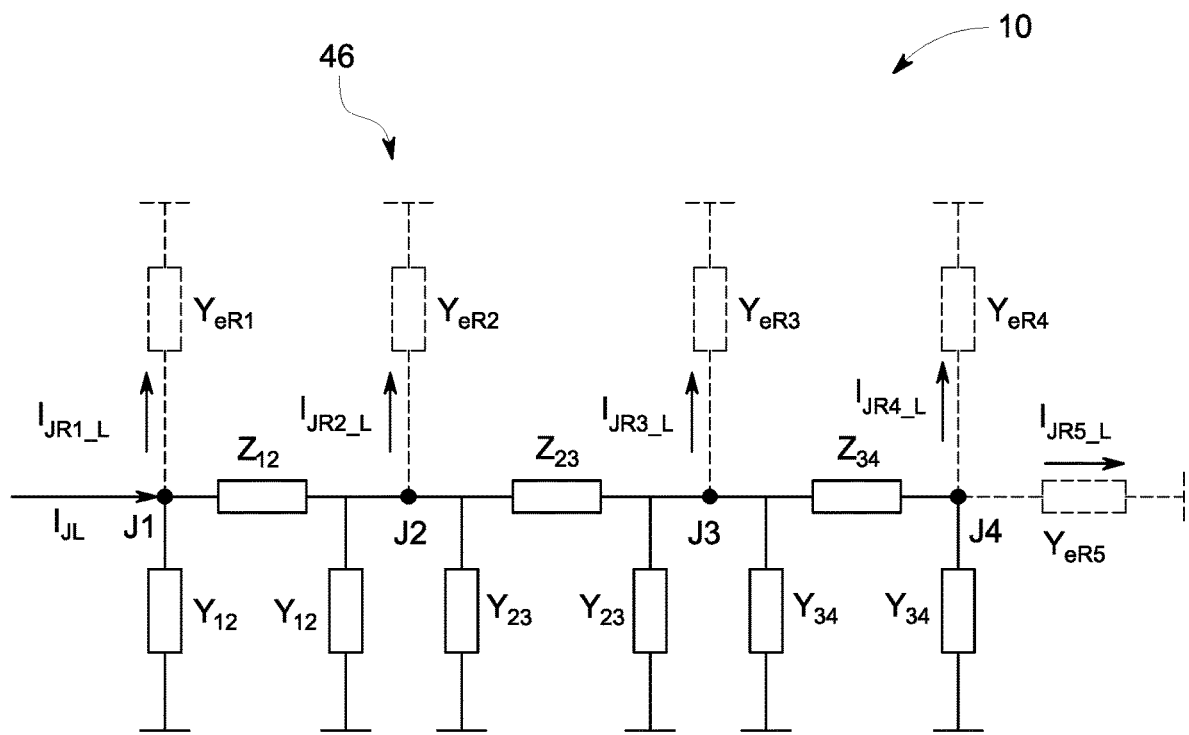
FIG. 5(b) shows an equivalent admittance representation of the power transmission scheme shown in FIG. 1.

Following such a step, the initial admittance matrix $Y_0$ is then combined with the equivalent admittance $y_{eR1}$, $y_{eR2}$, $y_{eR3}$, $y_{eR4}$, $y_{eR5}$ for each remote terminal R1, R2, R3, R4, R5 to establish an equivalent admittance matrix $Y_{Mod}$ in accordance with the equivalent admittance representation 46 of the power transmission scheme (10) shown in FIG. 5(b), i.e.:

$$Y_{Mod} = \begin{bmatrix} y_{12} + \frac{1}{z_{12}} + y_{eR1} & -\frac{1}{z_{12}} & 0 & 0 \\ -\frac{1}{z_{12}} & y_{12} + \frac{1}{z_{12}} + \frac{1}{z_{23}} + y_{23} + y_{eR2} & -\frac{1}{z_{23}} & 0 \\ 0 & -\frac{1}{z_{23}} & y_{23} + \frac{1}{z_{23}} + \frac{1}{z_{34}} + y_{34} + y_{eR3} & -\frac{1}{z_{34}} \\ 0 & 0 & -\frac{1}{z_{34}} & y_{34} + \frac{1}{z_{34}} + y_{eR4} + y_{eR5} \end{bmatrix}$$

Meanwhile the local equivalent current $i_{JL}$, i.e. a designated equivalent current, is obtained from the measured current $i_L$ at the local terminal L (available from corresponding COMTRADE data) by using the measured current $i_L$ at the local terminal L to calculate the local equivalent current $i_{JL}$ using a resistor-inductor model of the power transmission section 12 between the local terminal L and the first junction J1.

More particularly the power transmission section 12 between the local terminal L and the first junction J1 is regarded as a resistor-inductor series-connected circuit and, because the section is an overhead transmission line that is less than approximately 50 km, the shunt admittance can be neglected such that the local equivalent current $i_{JL}$ is given by $$i_{JL} = i_L$$

A similar resistor-inductor model can be used in other embodiments of the method when applied to a network in which the corresponding section of transmission medium between the local terminal and the first junction J1 is defined by an underground cable that is less than approximately 3 km.

In other embodiments of the method of invention, when applied to a network in which the power transmission section between the local terminal and the first junction is defined either by an overhead transmission line between approximately 50 km and 150 km in length, or by an underground cable that is between approximately 3 km and 20 km in length, the local equivalent current $i_{JL}$ can be obtained using a linear resistor-inductor-capacitor model of the aforesaid section of transmission medium, i.e. the parameters of resistance, inductance (or reactance) and shunt capacitance (or admittance) are considered to vary linearly along the said section. Such a linear resistor-inductor-capacitor model may also be known as a pi-equivalent circuit.

In such embodiments the local equivalent current $i_{JL}$ can be obtained by a sample based method or by a Fourier phase based method.

In terms of the Fourier phase based method, the local equivalent current $i_{JL}$ is given by $$i_{JL} = i_L - y_L \dot{V}_L / 2$$

where, $i_L$ is the Fourier phasor of measured current $i_L$ at the local terminal L, i.e. is the positive sequence current phasor $I_1$ corresponding to the local terminal L;

$\dot{V}_L$ is the Fourier phasor of measured voltage $v_L$ at the local terminal L, i.e. is the positive sequence voltage phasor $V_1$, corresponding to the local terminal L;

$i_{JL}$ is the Fourier phasor of the local equivalent current $i_{JL}$; and $Y_L$ is the shunt admittance of the power transmission section 12 between the local terminal L and the first junction J1.

With regards to the last parameter, i.e. the shunt admittance $y_L$, this can be determined by multiplying the admittance per length (which can be obtained from the operator of the said power transmission section 12) by the total length of the section.

In still further embodiments of the method of invention, when applied to a network in which the power transmission section 12 between the local terminal and the first junction is defined either by an overhead transmission line over approximately 150 km in length, or by an underground cable that is over approximately 20 km in length, the local equivalent current $i_{JL}$ can be obtained using a distributed parameter model of the aforesaid power transmission section 12.

In such embodiments the local equivalent current $i_{JL}$ can be obtained by a sample based method or by a Fourier phase based method, with the Fourier phase based method yielding the local node current $i_{JL}$ according to $$i_{JL} = \cosh(\gamma D) \dot{i}_L - \sinh(\gamma D) \dot{V}_L / Z_C$$

where,
- $\dot{i}_L$ is the Fourier phasor of measured current $i_L$ at the local terminal L, i.e. is the positive sequence current phasor $I_1$ corresponding to the local terminal L;
- $\dot{V}_L$ is the Fourier phasor of measured voltage $v_L$ at the local terminal L, i.e. is the positive sequence voltage phasor $V_1$, corresponding to the local terminal L;
- $\gamma = \sqrt{zy}$ is the propagation coefficient of the power transmission section 12, with z being the impedance per length and y being the shunt admittance per length of the power transmission section;
- $Z_C = \sqrt{z/y}$ is the character impedance of the power transmission section, with z again being the impedance per length and y being the shunt admittance per length of the power transmission section; and
- D is the length of the power transmission section between the local terminal L and the calculation node, i.e. the first junction J1.

The equivalent admittance matrix $Y_{Mod}$ and the local equivalent current $i_{JL}$ are then utilised to calculate the corresponding equivalent current $i_{JR1\_L}$, $i_{JR2\_L}$, $i_{JR3\_L}$, $i_{JR4\_L}$, $i_{JR5\_L}$ for each remote terminal R1, R2, R3, R4, R5 by, first of all determining an equivalent voltage $\dot{V}_{J1\_L}$, $\dot{V}_{J2\_L}$, $\dot{V}_{J3\_L}$, $\dot{V}_{J4\_L}$ at each junction J1, J2, J3, J4 according to:

$$\begin{bmatrix} \dot{V}_{J1\_L} \\ \dot{V}_{J2\_L} \\ \dot{V}_{J3\_L} \\ \dot{V}_{J4\_L} \end{bmatrix} = Y_{Mod} \begin{bmatrix} i_{JL} \\ 0 \\ 0 \\ 0 \end{bmatrix}, \text{ and}$$

then determining each equivalent current $i_{JR1\_L}$, $i_{JR2\_L}$, $i_{JR3\_L}$, $i_{JR4\_L}$, $i_{JR5\_L}$ according to:

$$i_{JR1\_L} = y_{eR1} \dot{V}_{J1\_L}$$

$$i_{JR2\_L} = y_{eR2} \dot{V}_{J2\_L}$$

$$i_{JR3\_L} = y_{eR3} \dot{V}_{J3\_L}$$

$$i_{JR4\_L} = y_{eR4} \dot{V}_{J4\_L}$$

$$i_{JR5\_L} = y_{eR5} \dot{V}_{J4\_L}$$

where,
- $i_{JR1\_L}$ is the Fourier phasor of the first equivalent current $i_{JR1\_L}$;
- $i_{JR2\_L}$ is the Fourier phasor of the second equivalent current $i_{JR2\_L}$;
- $i_{JR3\_L}$ is the Fourier phasor of the third equivalent current $i_{JR3\_L}$;
- $i_{JR4\_L}$ is the Fourier phasor of the fourth equivalent current $i_{JR4\_L}$;
- $i_{JR5\_L}$ is the Fourier phasor of the fifth equivalent current $i_{JR5\_L}$; and
- $i_{JL}$ is the Fourier phasor of the local equivalent current $i_{JL}$.

Thereafter, the step of equating, in respect of each remote terminal R1, R2, R3, R4, R5 a sum of the measured current $i_{JR1}$, $i_{JR2}$, $i_{JR3}$, $i_{JR4}$, $i_{JR5}$ and the calculated equivalent current $i_{JR1\_L}$, $i_{JR2\_L}$, $i_{JR3\_L}$, $i_{JR4\_L}$, $i_{JR5\_L}$ to zero according to Kirchhoff's first law, includes:

for the first remote terminal R1, equating to zero the sum of the first calculated equivalent current $i_{JR1\_L}$ and the first measured current $i_{JR1}$;

for the second remote terminal R2, equating to zero the sum of the second calculated equivalent current $i_{JR2\_L}$ and the second measured current $i_{JR2}$;

for the third remote terminal R3, equating to zero the sum of the third calculated equivalent current $i_{JR3\_L}$ and the third measured current $i_{JR3}$;

for the fourth remote terminal R4, equating to zero the sum of the fourth calculated equivalent current $i_{JR4\_L}$ and the fourth measured current $i_{JR4}$; and for the fifth remote terminal R5, equating to zero the sum of the fifth calculated equivalent current $i_{JR5\_L}$ and the fifth measured current $i_{JR5}$.

In other words, according to Kirchhoff's first law the sum of all currents flowing into the same node, i.e. the corresponding remote terminal R1, R2, R3, R4, R5, must be zero such that in respect of the first remote terminal R1

$$i_{JR1\_L} + i_{JR1} = 0$$

in respect of the second remote terminal R2

$$i_{JR2\_L} + i_{JR2} = 0$$

in respect of the third remote terminal R3

$$i_{JR3\_L} + i_{JR3} = 0$$

in respect of the fourth remote terminal R4

$$i_{JR4\_L} + i_{JR4} = 0$$

and in respect of the fifth remote terminal R5

$$i_{JR5\_L} + i_{JR5} = 0$$

Following the above, the step of extracting, in respect of each remote terminal R1, R2, R3, R4, R5 a corresponding synchronisation difference, which in the preferred embodiment described takes the form of a time difference Tp1, Tp2, Tp3, Tp4, Tp5 (although in other embodiments it may instead be a phase difference), between the measured voltage and current at the local terminal L and the measured voltage and current at the said respective remote terminal R1, R2, R3, R4, R5 from a corresponding equated sum of currents, i.e. from a corresponding one of the sums set out above, includes considering the phase of the said currents.

Accordingly, adopting a Fourier transform method to rewrite the sums set out above in a phasor form, and utilising respective phasors of the measured currents $i_{JR1}$, $i_{JR2}$, $i_{JR3}$, $i_{JR4}$, $i_{JR5}$ at each remote terminal R1, R2, R3, R4, R5 to incorporate the corresponding synchronisation difference, i.e. corresponding time difference Tp1, Tp2, Tp3, Tp4, Tp5 gives, in respect of the first remote terminal R1

$$i_{JR1\_L} + i_{JR1} e^{j\omega_0 T_{p1}} = 0$$

where,
- $i_{JR1\_L}$ is the Fourier phasor of the first equivalent current $i_{JR1\_L}$;
- $i_{JR1}$ is the Fourier phasor of the first measured current $i_{JR1}$ at the first remote terminal R1, i.e. is the positive sequence current phasor $I_1$ corresponding to the first remote terminal R1; and
- f is frequency of the currents $i_{JR1\_L}$, $i_{JR1}$, in respect of the second remote terminal R2

$$I_{JR2\_L} + i_{JR2} e^{j\omega_0 T_{p2}} = 0$$

where,
- $I_{JR2\_L}$ is the Fourier phasor of the second equivalent current $i_{JR2\_L}$;
- $I_{JR2}$ is the Fourier phasor of the second measured current $i_{JR2}$ at the second remote terminal R2, i.e. is the positive sequence current phasor $I_1$ corresponding to the second remote terminal R2; and
- f is frequency of the currents $i_{JR2\_L}$, $i_{JR2}$, in respect of the third remote terminal R3

$$i_{JR3\_L} + i_{JR3} e^{j\omega 0 Tp3} = 0$$

where,
- $i_{JR3\_L}$ is the Fourier phasor of the third equivalent current $i_{JR3\_L}$;
- $i_{JR3}$ is the Fourier phasor of the third measured current $i_{JR3}$ at the third remote terminal R3, i.e. is the positive sequence current phasor $I_1$ corresponding to the third remote terminal R3; and
- f is frequency of the currents $i_{JR3\_L}$, $i_{JR3}$, in respect of the fourth remote terminal R4

$$i_{JR4\_L} + i_{JR4} e^{j\omega 0 Tp4} = 0$$

where,
- $i_{JR4\_L}$ is the Fourier phasor of the fourth equivalent current $i_{JR4\_L}$;
- $i_{JR4}$ is the Fourier phasor of the fourth measured current $i_{JR4}$ at the fourth remote terminal R4, i.e. is the positive sequence current phasor $I_1$ corresponding to the fourth remote terminal R4; and
- f is frequency of the currents $i_{JR4\_L}$, $i_{JR4}$, and in respect of the fifth remote terminal R5

$$i_{JR5\_L} + i_{JR5} e^{j\omega 0 Tp5} = 0$$

where,
- $i_{JR5\_L}$ is the Fourier phasor of the fifth equivalent current $i_{JR5\_L}$;
- $i_{JR5}$ is the Fourier phasor of the fifth measured current $i_{JR5}$ at the fifth remote terminal R5, i.e. is the positive sequence current phasor $I_1$ corresponding to the fifth remote terminal R5; and
- f is frequency of the currents $i_{JR5\_L}$, $i_{JR5}$.

Each of the foregoing sums is then rearranged to give the corresponding time difference Tp1, Tp2, Tp3, Tp4, Tp5, i.e. such that the first time difference Tp1 is given by $$T_{p1} = \frac{\arg(-i_{JR1\_L}/i_{JR1})}{2\pi f}$$

where arg gives the angle of the aforementioned Fourier phasors,
the second time difference Tp2 is given by $$T_{p2} = \frac{\arg(-i_{JR2\_L}/i_{JR2})}{2\pi f}$$

the third initial time difference Tp3 is given by $$T_{p3} = \frac{\arg(-i_{JR3\_L}/i_{JR3})}{2\pi f}$$

the fourth time difference Tp4 is given by $$T_{p4} = \frac{\arg(-i_{JR4\_L}/i_{JR4})}{2\pi f}$$

and such that the fifth time difference Tp5 is given by $$T_{p5} = \frac{\arg(-i_{JR5\_L}/i_{JR5})}{2\pi f}$$

Following the determination of the synchronisation difference, i.e. the time difference Tp1, Tp2, Tp3, Tp4, Tp5 between the voltage and current measured at the local terminal L, i.e. the designated first terminal T1, and the voltage and current measured at each remote terminal R1, R2, R3, R4, R5, i.e. each other terminal T2, T3, T4, T5, T6, the method of the invention carries out principle step (d) of modifying the calculated voltage and current phasors, i.e. modifying the selected voltage and current phasors $V_T$, $I_T$ for each terminal T1, T2, T3, T4, T5, T6, to compensate for the synchronisation differences, i.e. the time differences Tp1, Tp2, Tp3, Tp4, Tp5.

Figure 6:
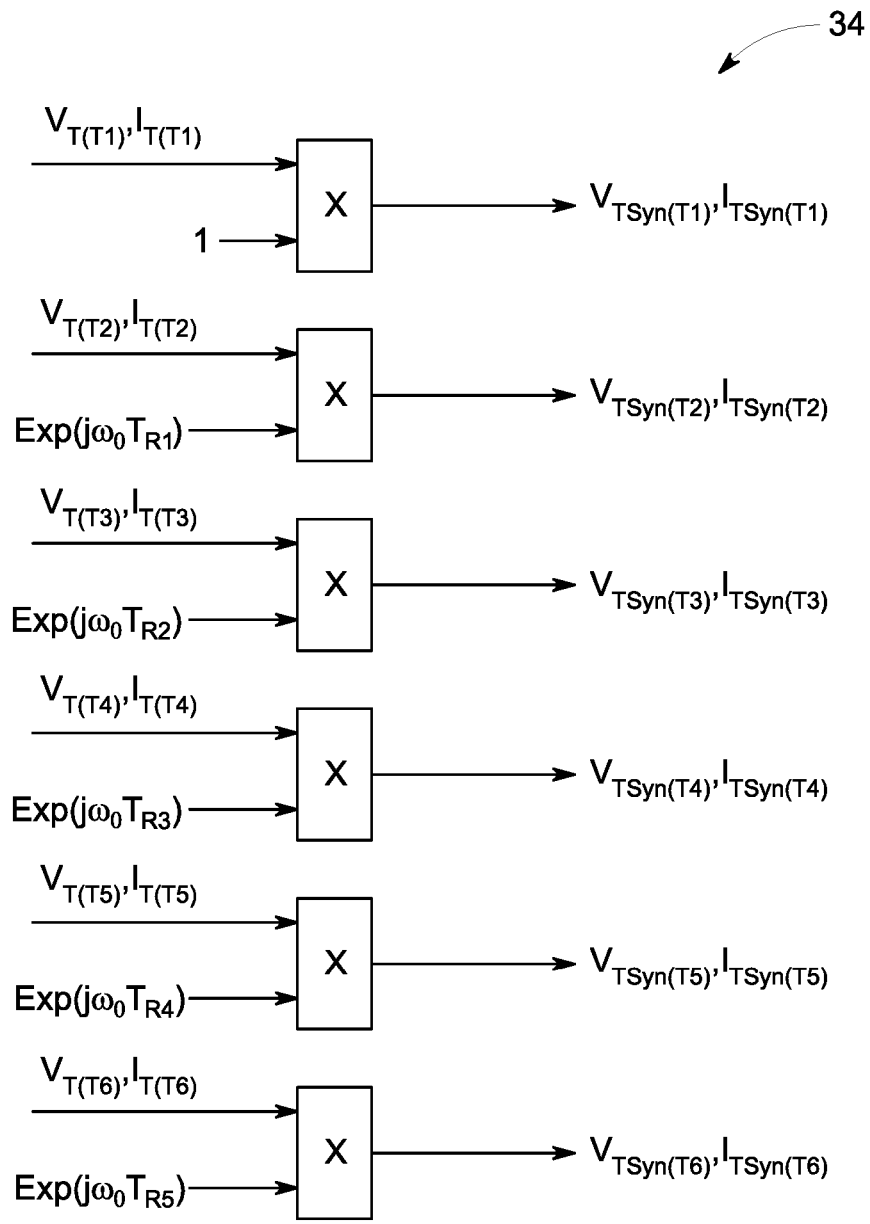
FIG. 6 shows various steps which take place within a seventh block shown in FIG. 2.

Such compensation takes place within a seventh block 34 shown in FIG. 2, and may be carried out by applying a compensation factor to the selected voltage and current phasors $V_T$, $I_T$ for each terminal T1, T2, T3, T4, T5, T6 (i.e. $V_{T(T1)}$, $I_{T(T1)}$ for the first terminal T1; $V_{T(T2)}$, $I_{T(T2)}$ for the second terminal T2; $V_{T(T3)}$, $I_{T(T3)}$ for the third terminal T3; $V_{T(T4)}$, $I_{T(T4)}$ for the fourth terminal T4; $V_{T(T5)}$, $I_{T(T5)}$ for the fifth terminal T5; and $V_{T(T6)}$, $I_{T(T6)}$ for the sixth terminal T6), as illustrated schematically in FIG. 6, to give rise to corresponding compensated voltage and current phasors $V_{TSyn}$, $I_{TSyn}$ (i.e. $V_{TSyn(T1)}$, $I_{TSyn(T1)}$ for the first terminal T1; $V_{TSyn(T2)}$, $I_{TSyn(T2)}$ for the second terminal T2; $V_{TSyn(T3)}$, $I_{TSyn(T3)}$ for the third terminal T3; $V_{TSyn(T4)}$, $I_{TSyn(T4)}$ for the fourth terminal T4; $V_{TSyn(T5)}$, $I_{TSyn(T5)}$ for the firth terminal T5; and $V_{TSyn(T6)}$, $I_{TSyn(T6)}$ for the sixth terminal T6).

The compensation factor preferably takes the form $$\exp(j\omega_0 T_x)$$

where,
- $\omega_0$ is the fundamental angular frequency of the power transmission scheme 10; and
- $T_x$ is the corresponding time difference, i.e. Tp1 for second terminal T2 (i.e. the first remote terminal R1), Tp2 for the third terminal T3 (i.e. the second remote terminal R2), Tp3 for the fourth terminal T4 (i.e. the third remote terminal R3), Tp4 for the fifth terminal T5 (i.e. the fourth remote terminal R4), and Tp5 for the sixth terminal T6 (i.e. the fifth remote terminal R5).

Thereafter the method of the invention carries out, within an eighth block 36 of FIG. 2, further principle step (e) of determining from the compensated voltage and current phasors $V_{TSyn}$, $I_{TSyn}$ the location of the fault.

Such a determination includes the main steps of:
- designating a terminal, e.g. the first terminal T1, at a first end 40 of the power transmission scheme 10 as a first end terminal and a terminal, e.g. the sixth terminal T6, at a second end 42 of the power transmission scheme 10 as a second end terminal;
- obtaining a first set of voltage phasors $V_{JL}$, wherein the first set of voltage phasors $V_{JL}$ includes the compensated voltage phasor at the first end terminal, i.e. the compensated voltage phasor $V_{TSyn(T1)}$ at the first terminal T1, and further includes respective voltage phasors at each of the second end terminal, i.e. the sixth terminal T6, and each junction J1, J2, J3, J4 that are determined based on the compensated first end terminal voltage phasor $V_{TSyn(T1)}$;

obtaining a second set of voltage phasors $V_{JR}$, wherein the second set of voltage phasors $V_{JR}$ includes the compensated voltage phasor at the second end terminal, i.e. the compensated voltage phasor $V_{TSyn(T6)}$ at the sixth terminal T6, and further includes respective voltage phasors at each of the first end terminal, i.e. the first terminal T1, and each junction J1, J2, J3, J4 that are determined based on the compensated second end terminal voltage phasor $V_{TSyn(T6)}$; and comparing the first and second sets of voltage phasors $V_{JL}$, $V_{JR}$ to identify the power transmission section 12 or junction J1, J2, J3, J4 corresponding to the location of the fault, wherein each voltage phasor of the first set of voltage phasors $V_{JL}$ is compared to the respective voltage phasor of the second set of voltage phasors $V_{JR}$ that corresponds to the same end terminal T1, T6 or junction J1, J2, J3, J4.

Figure 7:
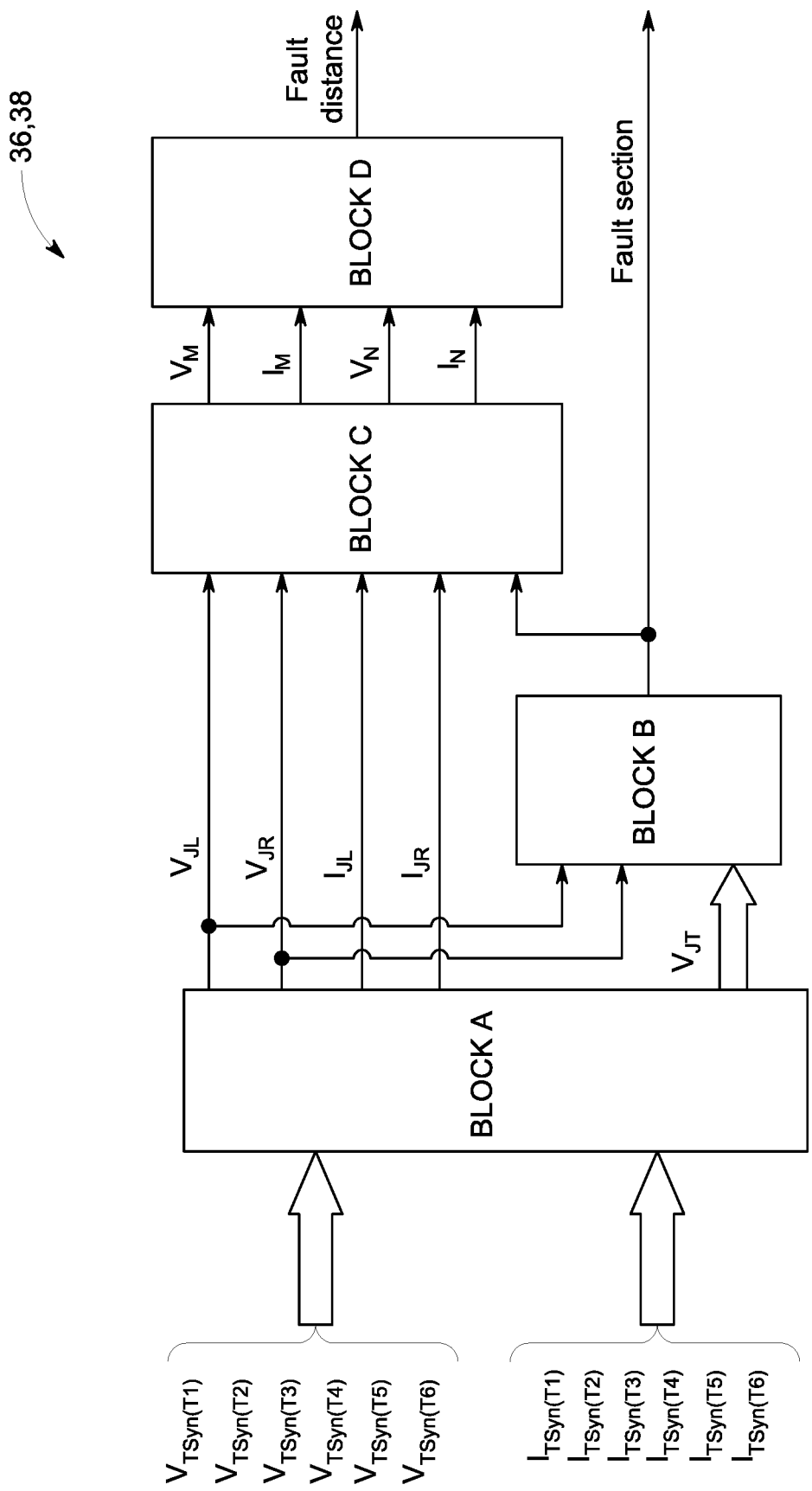
FIG. 7 shows a schematic view of an implementation structure which lies within an eighth block shown in FIG. 2.

A schematic view of a second implementation structure 38 which lies within the eighth block 36 and determines the location of the fault, including identifying the power transmission section 12 (or junction J1, J2, J3, J4) corresponding to the location of the fault and (in the embodiment method described) the distance of the fault along the given power transmission section 12, is illustrated schematically in FIG. 7.

More particularly, determining the location of the fault includes feeding the compensated voltage and current phasors $V_{TSyn}$, $I_{TSyn}$ for each terminal T1, T2, T3, T4, T5, T6 (i.e. $V_{TSyn(T1)}$, $I_{TSyn(T1)}$ for the first terminal T1; $V_{TSyn(T2)}$, $I_{TSyn(T2)}$ for the second terminal T2; $V_{TSyn(T3)}$, $I_{TSyn(T3)}$ for the third terminal T3; $V_{TSyn(T4)}$, $I_{TSyn(T4)}$ for the fourth terminal T4; $V_{TSyn(T5)}$, $I_{TSyn(T5)}$ for the firth terminal T5; and $V_{TSyn(T6)}$, $I_{TSyn(T6)}$ for the sixth terminal T6) into a Block A within the second implementation structure 38 to calculate, i.e. to obtain: first and second sets of voltage phasors $V_{JL}$, $V_{JR}$; first and second sets of current phasors $I_{JL}$, $I_{JR}$; and further voltage phasors $V_{JT}$.

Moving from the first terminal T1 to the sixth terminal T6 (i.e. left to right in FIG. 1), the first sets of voltage and current phasors $V_{JL}$, $I_{JL}$ are determined as follows.

In the first set of voltage phasors $V_{JL}$, for the purposes of the description below, the voltage phasor at the first terminal T1 (which for the purposes of simplification can temporarily be considered a zero junction $J_0$) is identified as $V_{J0L}$, the voltage phasor at junction $J_1$ is identified as $V_{J1L}$, the voltage phasor at junction $J_2$ is identified as $V_{J2L}$, the voltage phasor at junction $J_3$ is identified as $V_{J3L}$, the voltage phasor at junction $J_4$ is identified as $V_{J4L}$, and the voltage phasor at the sixth terminal T6 (which for the purposes of simplification can temporarily be considered a fifth junction $J_5$) is identified as $V_{J5L}$.

The first set of current phasors $I_{JL}$ includes the following current phasors (which are identified as indicated for the purposes of the description below): a current phasor in the power transmission section between the first terminal T1 and the first junction $J_1$ which is identified as $I_{J0\_J1L}$, a current phasor in the power transmission section between junctions $J_1$ and $J_2$ which is identified as $I_{J1\_J2L}$, a current phasor in the power transmission section between junctions $J_2$ and $J_3$ which is identified as $I_{J2\_J3L}$, a current phasor in the power transmission section between junctions $J_3$ and $J_4$ which is identified as $I_{J3\_J4L}$, and a current phasor in the power transmission section between junctions $J_4$ and $J_5$ which is identified as $I_{J4\_J5L}$.

The voltage phasor $V_{J0L}$ at the first terminal T1 is, as indicated above the compensated voltage phasor $V_{TSyn(T1)}$ for the first terminal T1, and similarly the current phasor $I_{J0\_J1L}$ in the power transmission section between the first terminal T1 and the first junction $J_1$ is the compensated current phasor $I_{TSyn(T1)}$ for the first terminal T1, i.e.

$$V_{J0L} = T_{Syn(T1)} I_{J0\_J1L} = I_{TSyn(T1)}$$

Each of the other voltage phasors $V_{J1L}, V_{J2L}, V_{J3L}, V_{J4L}, V_{J5L}$ at the respective junctions $J_1, J_2, J_3, J_4$ and the second end terminal, i.e. the sixth terminal T6 (which for purposes of simplification can, as indicated above, temporarily be considered a fifth junction $J_5$) is calculated based on the voltage phasor of the preceding junction and the current phasor of the preceding power transmission section. Each of the other current phasors $I_{J1\_J2L}, I_{J2\_J3L}, I_{J3\_J4L}, I_{J4\_J5L}$ in the respective power transmission sections are based on the voltage phasor of the preceding junction, the current phasor of the preceding power transmission section, and the current phasor in a further power transmission section connected to the preceding junction.

Accordingly, the foregoing are given by:

$$V_{JkL} = A_{Jk-1Jk} V_{Jk-1L} + B_{Jk-1Jk} I_{Jk-1\_JkL};$$

$$I_{Jk\_Jk+1L} = C_{Jk-1Jk} V_{Jk-1L} + D_{Jk-1\_JkL} + \sum_{n \in J_k} I_{Jk\_Tn};$$

where k ranges from 1 to 5;

$$A_{Jk-1Jk} = D_{Jk-1Jk} = \cosh(\gamma_{Jk-1Jk} l_{Jk-1Jk});$$

$$B_{Jk-1Jk} = -Z_{CJk-1Jk} \sinh(\gamma_{Jk-1Jk} l_{Jk-1Jk});$$

$$C_{Jk-1Jk} = -\sinh(\gamma_{Jk-1Jk} l_{Jk-1Jk}) / Z_{CJk-1Jk};$$

$$\gamma_{Jk-1Jk} = \sqrt{z_{Jk-1Jk} y_{Jk-1Jk}};$$

$$Z_{CJk-1Jk} = \sqrt{z_{Jk-1Jk} / y_{Jk-1Jk}};$$

$Z_{Jk-1Jk}$ is the impedance per length of the power transmission section interconnecting the k−1th junction to the kth junction;

$y_{Jk-1Jk}$ is the admittance per length of the power transmission section interconnecting the k−1th junction to the kth junction;

$l_{Jk-1Jk}$ is the line length of the power transmission section interconnecting the k−1th junction to kth the junction;

$I_{Jk\_Tn}$ is the nth-terminal-to-kth-junction current flowing in the further power transmission medium connected to the kth junction.

Moving from the sixth terminal T6, to the first terminal T1 (i.e. right to left in FIG. 1), the second sets of voltage and current phasors $V_{JR}$, $I_{JR}$ are determined as follows.

In the second set of voltage phasors $V_{JR}$, for the purposes of the description below, the voltage phasor at the first terminal T1 (which for the purposes of simplification can, as indicated above, temporarily be considered a zero junction $J_0$) is identified as $V_{J0R}$, the voltage phasor at junction $J_1$ is identified as $V_{J1R}$, the voltage phasor at junction $J_2$ is identified as $V_{J2R}$, the voltage phasor at junction $J_3$ is identified as $V_{J3R}$, the voltage phasor at junction $J_4$ is identified as $V_{J4R}$, and the voltage phasor at the sixth terminal T6 (which, for the purposes of simplification can, as indicted above, temporarily be considered a fifth junction $J_5$) is identified as $V_{J5R}$.

The second set of current phasors $I_{JR}$ includes the following current phasors (which are identified as indicated for the purposes of the description below): a current phasor in the power transmission section between the sixth terminal T6 and the fourth junction $J_4$ which is identified as $I_{J5\_J4R}$, a current phasor in the power transmission section between junctions $J_4$ and $J_3$ which is identified as $I_{J4\_J3R}$, a current phasor in the power transmission section between junctions $J_3$ and $J_2$ which is identified as $I_{J3\_J2R}$, a current phasor in the power transmission section between junctions $J_2$ and $J_1$ which is identified as $I_{J2\_J1R}$, and a current phasor in the power transmission section between junction $J_1$ and the first terminal T1 which is identified as $I_{J1\_J0R}$.

The voltage phasor $V_{J5R}$ at the sixth terminal T6 is, as indicated above, the compensated voltage phasor $V_{TSyn(T6)}$ for the sixth terminal T6, and similarly the current phasor $I_{J4\_J5L}$ in the power transmission section between junction $J_4$ and the sixth terminal T6 is the compensated current phasor $I_{TSyn(T6)}$ for the sixth terminal T6, i.e.

$$V_{J5R} = V_{TSyn(T6)} \ I_{J5\_J4R} = I_{TSyn(T6)}$$

Each of the other voltage phasors $V_{J0R}$, $V_{J1R}$, $V_{J2R}$, $V_{J3R}$, $V_{J4R}$ at the respective junctions $J_1$, $J_2$, $J_3$, $J_4$ and the first end terminal, i.e. the first terminal T1 (which for purposes of simplification can, as indicated above, temporarily be considered a zero junction $J_0$) is calculated based on the voltage phasor of the preceding junction and the current phasor of the preceding power transmission section. Each of the other current phasors $I_{J1\_J0R}, I_{J2\_J1R}, I_{J3\_J2R}, I_{J4\_J3R}$ in the respective power transmission sections are based on the voltage phasor of the preceding junction, the current phasor of the preceding power transmission section, and the current phasor in a further power transmission section connected to the preceding junction.

Accordingly the foregoing are given by:

$$V_{JkR} = A_{Jk+1Jk} V_{Jk+1R} + B_{Jk+1Jk} I_{Jk+1\_JkR};$$

$$I_{Jk\_Jk-1L} = C_{Jk+1Jk} V_{Jk+1R} + D_{Jk+1\_JkR} + \sum_{n \in J_k} I_{Jk\_Tn};$$

where k ranges from 0 to 4;

$$A_{Jk+1Jk} = D_{Jk+1Jk} = \cos h(\gamma_{Jk+1Jk} l_{Jk+1Jk});$$

$$B_{Jk+Jk} = -Z_{CJk+Jk} \sin h(\gamma_{Jk+1Jk} l_{Jk+1Jk});$$

$$C_{Jk+1Jk} = -\sin h(\gamma_{Jk+1Jk} l_{Jk+1Jk})/Z_{CJk+1Jk};$$

$$\gamma_{Jk+1Jk} = \sqrt{z_{Jk+1Jk} y_{Jk+1Jk}};$$

$$Z_{Jk+1Jk} = \sqrt{z_{Jk+1Jk} y_{Jk+1Jk}};$$

- $Z_{Jk+1Jk}$ is the impedance per length of the power transmission section interconnecting the k+1th junction to kth junction;
- $y_{Jk+1Jk}$ is the admittance per length of the power transmission section interconnecting the k+1th junction to the kth junction;
- $l_{Jk+1Jk}$ is the line length of the power transmission section interconnecting the k+1th junction to the kth junction;
- $I_{Jk\_Tn}$ is the nth-terminal-to-kth-junction current flowing in the further power transmission medium connected to the kth junction.

The further voltage phasors $V_{JT}$, include the following further voltage phasors (which are identified as indicated for the purposes of the description below): a further voltage phasor at junction $J_1$ which is identified as $V_{J1\_T2}$, a further voltage phasor at junction $J_2$ which is identified as $V_{J2\_T3}$, a further voltage phasor at junction $J_3$ which is identified as $V_{J3\_T4}$, and a further voltage phasor at junction $J_4$ which is identified as $V_{J4\_T5}$.

Further current phasors in respective further power transmissions sections are also calculated. These further current phasors $I_{JT}$ include the following current phasors (which are identified as indicated for the purposes of the description below): a further current phasor in the further power transmission section between junction $J_1$ and terminal T2 which is identified as $I_{J1\_T2}$, a further current phasor in the further power transmission section between junction $J_2$ and terminal T3 which is identified as $I_{J2\_T3}$, a further current phasor in the further power transmission section between junction $J_3$ and terminal T4 which is identified as $I_{J3\_T4}$, and a further current phasor in the further power transmission section between junction $J_4$ and terminal T5 which is identified as $I_{J4\_T5}$.

The further voltage and current phasors for junction $J_1$ with respect to terminal T2 are calculated by the following equations:

$$\begin{cases} V_{J1\_T2} = A_2 V_{TSyn(T2)} + B_2 I_{TSyn(T2)} \\ I_{J1\_T2} = C_2 V_{TSyn(T2)} + D_2 I_{TSyn(T2)} \end{cases}$$

where, $$A_2 = D_2 = \cos h(\gamma_2 l_{T2});$$

$$B_2 = -Z_{C2} \sin h(\gamma_2 l_{T2});$$

$$C_2 = -\sin h(\gamma_2 l_{T2})/Z_{C2};$$

$$\gamma_2 = \sqrt{z_2 y_2};$$

$$Z_{C2} = \sqrt{z_2/y_2};$$

- $z_2$ is the impedance per length of the further power transmission section interconnecting junction $J_1$ to terminal T2;
- $y_2$ is the admittance per length of the further power transmission section interconnecting junction $J_1$ to terminal T2;
- $l_{T2}$ is the line length of the further power transmission section interconnecting junction $J_1$ to terminal T2.

The further voltage and current phasors for junction $J_2$ with respect to terminal T3 are calculated by the following equations:

$$\begin{cases} V_{J2\_T3} = A_3 V_{TSyn(T3)} + B_3 I_{TSyn(T3)} \\ I_{J2\_T3} = C_3 V_{TSyn(T3)} + D_3 I_{TSyn(T3)} \end{cases}$$

where, $$A_3 = D_3 = \cos h(\gamma_3 l_{T3});$$

$$B_3 = -Z_{C3} \sin h(\gamma_3 l_{T3});$$

$$C_3 = -\sin h(\gamma_3 l_{T3})/Z_{C3};$$

$$\gamma_3 = \sqrt{z_3 y_3};$$

$$Z_{C3} = \sqrt{z_3/y_3};$$

$Z_3$ is the impedance per length of the further power transmission section interconnecting junction $J_2$ to terminal T3;

$y_3$ is the admittance per length of the further power transmission section interconnecting junction $J_2$ to terminal T3;

$l_{T3}$ is the line length of the further power transmission section interconnecting junction $J_2$ to terminal T3.

The further voltage and current phasors for junction $J_3$ with respect to terminal T4 are calculated by the following equations:

$$\begin{cases} V_{J3\_T4} = A_4 V_{TSyn(T4)} + B_4 I_{TSyn(T4)} \\ I_{J3\_T4} = C_4 V_{Tsyn(T4)} + D_4 I_{TSyn(T4)} \end{cases}$$

where, $A_4 = D_4 = \cos h(\gamma_4 l_{T4})$;

$B_4 = -Z_{C4} \sin h(\gamma_4 l_{T4})$;

$C_4 = -\sin h(\gamma_4 l_{T4})/Z_{C4}$;

$\gamma_4 = \sqrt{z_4 y_4}$;

$Z_{C4} = \sqrt{z_4/y_4}$;

$z_4$ is the impedance per length of the further power transmission section interconnecting junction $J_3$ to terminal T4;

$y_4$ is the admittance per length of the further power transmission section interconnecting junction $J_3$ to terminal T4;

$l_{T4}$ is the line length of the further power transmission section interconnecting junction $J_3$ to terminal T4.

The further voltage and current phasors for junction $J_4$ with respect to terminal T5 are calculated by the following equations:

$$\begin{cases} V_{J4\_T5} = A_5 V_{TSyn(T5)} + B_5 I_{TSyn(T5)} \\ I_{J4\_T5} = C_5 V_{Tsyn(T5)} + D_5 I_{TSyn(T5)} \end{cases}$$

where, $A_5 = D_5 = \cos h(\gamma_5 l_{T5})$;

$B_5 = -Z_{C5} \sin h(\gamma_5 l_{T5})$;

$C_5 = -\sin h(\gamma_5 l_{T5})/Z_{C5}$;

$\gamma_5 = \sqrt{z_5 y_5}$;

$Z_{C5} = \sqrt{z_5/y_5}$;

$z_5$ is the impedance per length of the further power transmission section interconnecting junction $J_4$ to terminal T5;

$y_5$ is the admittance of the further power transmission section interconnecting junction $J_4$ to terminal T5;

$l_{T5}$ is the line length of the further power transmission section interconnecting junction $J_4$ to terminal T5).

The first and second sets of voltage phasors $V_{JL}, V_{VR}$ and the further voltage phasors $V_{JT}$ are then fed into a Block B within the second implementation structure 38 to compare the voltage phasors to identify the power transmission section or junction corresponding to the location of the fault, as follows.

A subtraction voltage phasor for each junction is obtained. In this regard the subtraction voltage phasor of each junction is equal to the difference between the corresponding voltage phasors of the first and second sets of voltage phasors $V_{JL}, V_{JR}$, as shown in the following equation.

$$\Delta V_j = \begin{bmatrix} \Delta V_{J0} \\ \Delta V_{J1} \\ \Delta V_{J2} \\ \Delta V_{J3} \\ \Delta V_{J4} \\ \Delta V_{J5} \end{bmatrix} = \begin{bmatrix} V_{J0L} - V_{J0R} \\ V_{J1L} - V_{J1R} \\ V_{J2L} - V_{J2R} \\ V_{J3L} - V_{J3R} \\ V_{J4L} - V_{J4R} \\ V_{J5L} - V_{J5R} \end{bmatrix}$$

Then the minimum amplitude value (modular) ΔVmin of the plurality of subtraction voltage phasors ΔVj is determined using the equation: $\Delta Vmin = \min\{|\Delta V_{Jk}|, k=0,1,2,3,4,5\}$.

The minimum amplitude value ΔVmin is subsequently compared with a predefined voltage threshold Vthres1 to determine whether ΔVmin is less than Vthres1. Vthres1 is exemplarily set at 0.02 times of the rated voltage of the power transmission scheme 10 so that, for example, if the rated voltage is 110 V, then Vthres1 is 2.2 V.

If the minimum amplitude value ΔVmin is less than the predefined voltage threshold Vthres1, it indicates that the fault is either on the junction corresponding to the minimum amplitude value ΔVmin or in the further power transmission section connected to this junction. For example, if $|\Delta V_{J3}| = \Delta Vmin$, it indicates that the fault is either on the junction $J_3$ or in the further power transmission section interconnecting the junction $J_3$ and the terminal $T_4$.

Subsequently the location of the fault is more accurately determined by using the discriminative criterion of $|V_{JkL} - V_{Jk\_Tn}| > Vthres2$, where $\Delta Vmin = V_{JkL}$. Therefore, for example, if $|\Delta V_{J3}| = \Delta Vmin$, the discriminative criterion is $|V_{J3L} - V_{J3\_T4}| > Vthres2$. Vthres1 is exemplarily set at 0.05 times of the rated voltage of the power transmission scheme so that, for example, if the rated voltage is 110 V, then Vthres1 is 5.5 V.

If $|V_{JkL} - V_{Jk\_Tn}| > Vthres2$, then the fault is located in the further power transmission section interconnecting the kth junction and the nth terminal. If $|V_{JkL} - V_{Jk\_Tn}| <= Vthres2$, then the fault is located on the kth junction. If there are multiple terminals connected to the junction in question, the discriminative criterion is applied to each terminal in turn.

If the minimum amplitude value ΔVmin is more than the predefined voltage threshold Vthres1, it indicates that the fault is in the power transmission section interconnecting the kth junction and the k+1th junction. For example, if $|\Delta V_{J3}| = \Delta Vmin$, it indicates that the fault is in the power transmission sections interconnecting the junctions $J_0, J_1, J_2, J_3, J_4, J_5$.

Subsequently the location of the fault is more accurately determined by comparing the voltage phasor of a given junction with the voltage phasor of a neighbouring junction to identify the power transmission section corresponding to the location of the fault. Different criterion may be applied to determine the power transmission section in which the fault is located.

In a first exemplary criterion, the power transmission section in which the fault is located is determined by comparing the phases of the subtraction voltage phasor $\Delta V_{Jk}$ of a given junction and the subtraction voltage phasor $\Delta V_{Jk+1}$ of a neighbouring junction to check whether the comparison meets the following criterion:

$$90° < \arg\frac{\Delta V_{Jk}}{\Delta V_{Jk+1}} < 270°$$

If the criterion is met, then the fault is located in the power transmission section interconnecting junctions $J_k$ and $J_{k+1}$.

In a second exemplary criterion, the power transmission section in which the fault is located is determined by comparing the amplitudes of the subtraction voltage phasor $\Delta V_{Jk}$ of a given junction and the subtraction voltage phasor $\Delta V_{Jk+1}$ of a neighbouring junction to check whether an amplitude comparison meets the following criterion:

$$imag\left(\frac{\Delta V_{Jk} conj(\Delta V_{Jk+1})}{|\Delta V_{Jk}||\Delta V_{Jk+1}|}\right) < \varepsilon_1$$

where $\varepsilon_1$ is the threshold with per-unit value. For example, $\varepsilon_1 = -0.01$.

If the criterion is met, then the fault is located in the power transmission section interconnecting junctions $J_k$ and $J_{k+1}$.

In a third exemplary criterion, the power transmission section in which the fault is located is determined by comparing the subtraction voltage phasor $\Delta V_{Jk}$ of a given junction and the subtraction voltage phasor $\Delta V_{Jk+1}$ of a neighbouring junction to check whether the comparison meets the following criterion.

$$|\Delta V_{jk} + \Delta V_{Jk+1}| < |\Delta V_{Jk} - \Delta V_{Jk+1}|$$

If the criterion is met, then the fault is located in the power transmission section interconnecting junctions $J_k$ and $J_{k+1}$.

If a given power transmission section is identified as the location of the fault, a Block C within the second implementation structure then selects the appropriate voltage and current phasors from the first and second sets of voltage and current phasors $V_{JL}$, $V_{JR}$, $I_{JL}$ and $I_{JR}$ and forms a two-ended system equivalent of the power transmission section identified as the location of the fault with voltages and currents $V_M$, $V_N$, $I_M$, $I_N$.

If the relevant power transmission section is connected between junctions $J_k$ and $J_{k+1}$, the voltage and current phasors $V_{JkL}$, $I_{Jk\_k+1L}$, $V_{Jk+1R}$, $I_{Jk+1,kR}$ are selected to form the two-ended system equivalent such that: $V_M = V_{JkL}$; $I_M = I_{Jk\_k+1L}$; $V_N = V_{Jk+1R}$; and $I_N = I_{Jk+1\_kR}$. That is, junction $J_k$ is the equivalent end M of the two-ended system equivalent, and junction $J_{k+1}$ is the equivalent N of the two-ended system equivalent.

If the relevant power transmission section is a further power transmission section interconnecting a junction $J_k$ and a terminal Tn, Block C then selects the voltage and current phasors at the terminal Tn, the voltage phasor $V_{JkL}$, $V_{JkR}$ at the junction to which the terminal Tn is connected, and the negative summation of the corresponding current phasors of the first and second sets of current phasors $-(I_{Jk,\ k+1R} + I_{Jk,k-1R})$, such that: $V_M = V_{Tn}$; $I_M = I_{Tn}$; $V_N = V_{JkL}$; $I_N = -(I_{Jk,\ k+1L} + I_{Jk\_k-1R})$. That is, terminal Tn is the equivalent end M of the two-ended system equivalent, and junction $J_k$ is the equivalent end N of the two-ended system equivalent.

Based on the two-ended system equivalent the distance of the fault along the power transmission section is determined on the basis of the voltage and currents $V_M, V_N, I_M, I_N$ of the two-ended system equivalent. In the second implementation structure 38, Block C feeds the voltage and currents $V_M, V_N, I_M, I_N$ of the two-ended system equivalent to a Block D, which determines the fault distance using the following equation:

$$V_M \cos h(\gamma x) - Z_C I_M \sin h(\gamma x) = V_N \cos h(\gamma(l-x)) - Z_C I_N \sin h(\gamma(l-x))$$

where
x is the distance to the end M of the two-system equivalent;

$\gamma = \sqrt{zy}$;

$Z_C = \sqrt{z/y}$;

z is the impedance per length of corresponding section, which is settable by customer;
y is the admittance per length of corresponding section, which is settable by customer;
l is the line length of corresponding section.

The above equation can be simplified as:

$$V_M - zxI_M = V_N - z(l-x)I_N$$

The invention claimed is:

1. A method of locating a fault in a multi-terminal electrical power transmission scheme in which each terminal is connected with a junction via a power transmission section and the each junction interconnects a plurality of power transmission sections, the method comprising:
    (a) measuring the voltage and current at each terminal;
    (b) calculating from the measured voltage and current at each terminal corresponding voltage and current phasors;
    (c) determining from the calculated voltage and current phasors a synchronization difference between the measured voltage and current at a designated terminal and the measured voltage and current at the or each other terminal, wherein the synchronization difference is a time difference;
    (d) modifying the calculated voltage and current phasors to compensate for the or each synchronization difference; and
    (e) determining from the compensated voltage and current phasors the location of the fault.

2. The method of claim 1, wherein (a) measuring the voltage and current at each terminal further comprises resampling the measured voltage and current from one or more terminals.

3. The method of claim 1, wherein the power transmission scheme is a multi-phase power transmission scheme, wherein (a) measuring the voltage and current at each terminal further comprises measuring the voltage and current of each phase at each terminal, and wherein (b) calculating from the measured voltage and current at each terminal corresponding voltage and current phasors further comprises converting the measured voltage and current at each terminal into respective phase phasors and then transforming the phase phasors into respective positive and negative sequence voltage phasors and positive and negative sequence current phasors.

4. The method of claim 2, further comprising determining from the measured current from the one or more terminals whether a fault has occurred and if a fault has occurred whether it effects all phases of the power transmission scheme.

5. The method of claim 4, wherein if the fault effects all phases of the power transmission scheme then the positive sequence voltage and current phasors are used in subsequent operations, otherwise the negative sequence voltage and current phasors are used.

6. The method of claim 1, wherein (c) determining from the calculated voltage and current phasors a synchronization difference between the measured voltage and current at a designated terminal and the measured voltage and current at the or each other terminal further comprises:
   calculating, with respect to the designated terminal, an equivalent current flowing at the or each other terminal;
   equating, in respect of the or each other terminal, a sum of the measured current and the calculated equivalent current to zero according to Kirchhoff's first law; and
   extracting, in respect of the or each other terminal a synchronization difference between the measured voltage and current at the designated terminal and the measured voltage and current at the said respective other terminal from a corresponding equated sum of currents.

7. The method of claim 5, wherein calculating, with respect to the designated terminal, an equivalent current flowing at the or each other terminal comprises establishing an equivalent admittance matrix for the power transmission scheme.

8. The method of claim 1, wherein (e) determining from the compensated voltage and current phasors the location of the fault further comprises:
   designating a terminal at a first end of the power transmission scheme as a first end terminal and a terminal at a second end of the power transmission scheme as a second end terminal;
   obtaining a first set of voltage phasors, wherein the first set of voltage phasors comprises the compensated voltage phasor at the first end terminal and further comprises respective voltage phasors at each of the second end terminal and the or each junction that are determined based on the compensated first end terminal voltage phasor;
   obtaining a second set of voltage phasors, wherein the second set of voltage phasors comprises the compensated voltage phasor at the second end terminal and further comprises respective voltage phasors at each of the first end terminal and the or each junction that are determined based on the compensated second end terminal voltage phasor; and
   comparing the first and second sets of voltage phasors to identify the power transmission section or junction corresponding to the location of the fault, wherein each voltage phasor of the first set of voltage phasors is compared to the respective voltage phasor of the second set of voltage phasors that corresponds to the same end terminal or junction.

9. The method of claim 8, further comprising, if a given power transmission section is identified as the location of the fault, determining the distance of the fault along the power transmission section using corresponding voltages and currents of an equivalent two-ended system.

* * * * *